(12) United States Patent
Wu et al.

(10) Patent No.: US 9,099,859 B2
(45) Date of Patent: Aug. 4, 2015

(54) ELECTRO-STATIC DISCHARGE PROTECTION CIRCUIT, ARRAY SUBSTRATE AND DISPLAY APPARATUS

(71) Applicant: BOE Technology Group Co., Ltd., Beijing (CN)

(72) Inventors: Zhongyuan Wu, Beijing (CN); Liye Duan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 13/995,134

(22) PCT Filed: Nov. 21, 2012

(86) PCT No.: PCT/CN2012/084979
§ 371 (c)(1),
(2) Date: Jun. 17, 2013

(87) PCT Pub. No.: WO2013/189152
PCT Pub. Date: Dec. 27, 2013

(65) Prior Publication Data
US 2014/0192444 A1 Jul. 10, 2014

(30) Foreign Application Priority Data

Jun. 21, 2012 (CN) .......................... 2012 1 0212575

(51) Int. Cl.
*H02H 9/00* (2006.01)
*H02H 9/04* (2006.01)
(Continued)

(52) U.S. Cl.
CPC ........... *H02H 9/04* (2013.01); *G02F 1/136204* (2013.01); *G09G 3/20* (2013.01); *H01L 27/0296* (2013.01); *H02H 3/046* (2013.01); *G09G 2330/04* (2013.01)

(58) Field of Classification Search
CPC .................................................. H01L 27/0266

USPC .............................................. 361/56; 349/40
See application file for complete search history.

(56) References Cited

U.S. PATENT DOCUMENTS 5,606,340 A * 2/1997 Suzuki et al. .................... 345/87
6,741,037 B2 * 5/2004 Lee ............................. 315/169.1
(Continued)

FOREIGN PATENT DOCUMENTS

CN     1766722 A     5/2006
CN     1848435 A     10/2006
(Continued)

OTHER PUBLICATIONS

PCT International Search Report (Chinese language) issued by SIPO on Mar. 28, 2013, 13 pages.
(Continued)

*Primary Examiner* — Thienvu Tran
*Assistant Examiner* — Ann Hoang

(57) ABSTRACT

Provided is an electro-static discharge protection circuit, an array substrate and a display apparatus, being capable of reducing power consumption while improving reliability of the display apparatus. The electro-static discharging protection circuit comprises: a first thin film transistor (T1), having a drain connected to a high level output terminal (VGH); a second thin film transistor (T2), having a source connected to a source of the first thin film transistor (T1) as a discharging terminal (O), a drain connected to the high level output terminal (VGH) and a gate connected to a low level output terminal (VGL); a third thin film transistor (T3), having a source and a gate connected to the low level output terminal (VGL) and a drain connected to the gate of the first thin film transistor (T1); and a voltage difference maintaining unit connected between the gate of the first thin film transistor (T1) and the discharging terminal (O), wherein the voltage difference maintaining unit is used to make the voltage difference between the gate of the first thin film transistor (T1) and the discharging terminal (O) maintain unchanged, the discharging terminal (O) being used for connecting gate lines or data lines.

7 Claims, 2 Drawing Sheets

(51) Int. Cl.
  *H01L 27/02* (2006.01)
  *G02F 1/1362* (2006.01)
  *G09G 3/20* (2006.01)
  *H02H 3/04* (2006.01)

(56) References Cited

U.S. PATENT DOCUMENTS

| | | | |
|---|---|---|---|
| 8,390,044 B2 * | 3/2013 | Kawae et al. | 257/292 |
| 2006/0001098 A1 | 1/2006 | Yang et al. | |
| 2006/0006417 A1 * | 1/2006 | Kim et al. | 257/197 |
| 2006/0119757 A1 * | 6/2006 | Tsao | 349/40 |
| 2006/0119998 A1 * | 6/2006 | Yang et al. | 361/56 |

FOREIGN PATENT DOCUMENTS

| | | |
|---|---|---|
| CN | 1885541 A | 12/2006 |
| CN | 101089685 A | 12/2007 |

OTHER PUBLICATIONS

English abstract of CN101089685A (listed above), 1 page.
English abstract of CN1885541A (listed above), 1 page.
English abstract of CN1848435A (listed above), 1 page.
English abstract of CN1766722A (listed above), 1 page.

* cited by examiner

ELECTRO-STATIC DISCHARGE PROTECTION CIRCUIT, ARRAY SUBSTRATE AND DISPLAY APPARATUS

CROSS REFERENCE TO RELATED APPLICATIONS

This application is based on International Application No. PCT/CN2012/084979 filed on Nov. 21, 2012, which claims priority to Chinese National Application No. 201210212575.0 filed on Jun. 21, 2012, the contents of which are incorporated herein by reference.

FIELD OF INVENTION

The present invention relates to technical field of display technology, in particular to an electro-static discharge protection circuit, an array substrate and a display apparatus.

BACKGROUND

In active matrix display, the crossings of scan lines in rows and data lines in columns form an active matrix. In order to prevent devices on a panel from being damaged by electro-static discharge (ESD) during processes of manufacturing and use, it is necessary to connect an electro-static discharge protection circuit to every data line, for discharging accumulated charges, so as to avoid damage to the devices due to too high voltage pulses.

Currently, there are various kinds of manufacturing process for thin film transistors (TFT) in display apparatus rear panels, for example, amorphous silicon (a-Si) TFT, low temperature poly-silicon (LTPS) TFT and Oxide TFT etc. The Oxide TFT has features of high mobility, good uniformity and low cost, and it is suitable for manufacturing of large size panel. However, due to the restriction to oxide TFT manufacturing itself, the oxide TFT is always of depletion type, i.e. when the gate-source voltage Vgs of a TFT is zero, the drain-source of the TFT is still turned on. The TFT in the conventional ESD protection circuit does not function when the display apparatus is in normal operation at ordinary time, and functions only when static charge occurs. However, if the TFT is of depletion type, the ESD protection circuit still generates drain-source current when the display apparatus is in normal operation at ordinary time. For example, as shown in FIG. 1, when the display apparatus is in normal operation at ordinary time, Vgs for two TFTs is 0V, i.e. Vgs=0V. According to the transmission characteristics of the depletion type TFT, the drain-source of the two TFTs is still continuously turned on, so that a direct current channel from high level output terminal VGH to low level output terminal VGL is formed, resulting in leak electricity from the data line DATA. This affects the output of the data voltage while increasing power consumption.

SUMMARY

According to embodiments of the invention, provided is an electro-static discharge protection circuit, an array substrate and a display apparatus being capable of reducing power loss while improving reliability of the display apparatus.

In order to solve the above mentioned technical problem, the embodiments of the present invention adopt the following technical solutions:

An electro-static discharging protection circuit comprising: a first thin film transistor, having a drain connected to a high level output terminal; a second thin film transistor, having a source connected to a source of the first thin film transistor as a discharging terminal, a drain connected to the high level output terminal and a gate connected to a low level output terminal; a third thin film transistor, having a source and a gate connected to the low level output terminal, and a drain connected to the gate of the first thin film transistor; and a voltage difference maintaining unit connected between the gate of the first thin film transistor and the discharging terminal, wherein the voltage difference maintaining unit is used to make the voltage difference between the gate of the first thin film transistor and the discharging terminal maintain unchanged, the discharging terminal being used for connecting gate lines or data lines.

According to an embodiment of the invention, the voltage difference maintaining unit is a capacitor.

According to another embodiment of the invention, the voltage difference maintaining unit is a fourth thin film transistor, having a source connected to a drain thereof and the gate of the first thin film transistor, and a gate connected to the discharging terminal.

An array substrate comprising: a plurality of gate lines and data lines;

a plurality of above mentioned electro-static discharging protection circuits;

wherein each of the gate lines and/or data lines is connected to the discharging terminal of one of the electro-static discharging circuits.

A display apparatus comprising: the above mentioned array substrate. When the display apparatus is in normal operation, voltage of a high level output terminal is greater than voltage of a discharging terminal and voltage of the discharging terminal is greater than voltage of a low level output terminal. At this time, since both of the gate and the source of the third thin film transistor are connected to the low level terminal, the third thin film transistor is turned on, so that the gate voltage of the first thin film transistor is released to the low level output terminal. The gate-source voltage of the first thin film transistor is equal to the voltage of the low level output terminal subtracted by the voltage of the discharging terminal. The first thin film transistor is turned off. Meanwhile, the gate-source voltage of the second thin film transistor is equal to the voltage of the low level output terminal subtracted by the voltage of the discharging terminal, and thus the second thin film transistor is also turned off. Therefore, when the display apparatus is in normal operation, it does not affect the normal displaying of the display apparatus. The embodiments according to the invention solve the problem of leak electricity from the depletion type TFT existing in conventional ESD protection circuits when the display apparatus is in normal operation. It decreases the power consumption while increasing the reliability of the display apparatus.

BRIEF DESCRIPTION OF THE DRAWINGS

In order to explain technical solutions of the embodiments of the present invention or prior art more clearly, the accompanying drawings which are needed in the description of the embodiments of the present invention or prior art will be briefly introduced hereinafter. Obviously, the accompanying drawings are merely some embodiments of the present invention, and those skilled in this art can obtain other drawings according to the accompany drawings, without paying any inventive labor.

DETAILED DESCRIPTION

The technical solutions of the embodiments of the present invention will be described clearly and completely in combination with the accompany drawings of the embodiments of the present invention. Obviously, the described embodiments are only part of embodiments of the present invention, and are not all of the embodiments. Based on the embodiments of the present invention, all other embodiments obtained by those skilled in this art without paying any inventive labor belong to the scope of the present invention sought for protection.

Figure 1:
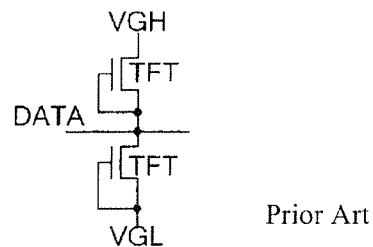
FIG. 1 is a schematic diagram of an electro-static discharging protection circuit in the prior art.
Figure 2:
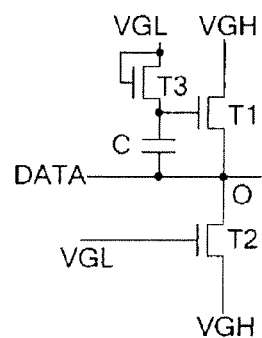
FIG. 2 is a schematic diagram of an electro-static discharging protection circuit according to an embodiment of the present invention.

As shown in FIG. 2, according to an embodiment of the present invention, provided is an electro-static discharge protection, comprising: a first thin film transistor T1, having a drain connected to a high level output terminal represented as VGH; a second thin film transistor T2, having a source connected to a source of the first thin film transistor T1 as a discharging terminal O, a drain connected to the high level output terminal VGH, a gate connected to a low level output terminal represented as VGL; a third thin film transistor T3, having a source and a gate connected to the low level output terminal VGL, and a drain connected to a gate of the first thin film transistor T1; and a voltage difference maintaining unit connected between the gate of the first thin film transistor T1 and the discharging terminal O, wherein the voltage difference maintaining unit is used to make the voltage difference between the gate of the first thin film transistor T1 and the discharging terminal O maintain unchanged, and the discharging terminal O is used for connecting the gate lines or data lines. In particular, the voltage difference maintaining unit can be a capacitor C. Wherein, the discharging terminal can be connected to a data line DATA for discharging static charge on the data line. The circuit is used for an array substrate made up of depletion type of TFTs, i.e. the thin film transistors in the ESD protection circuit are depletion type.

Below takes releasing the static charge on the data line as an example further illustrate the operating principle of the above mentioned ESD protection circuit. When the display apparatus is in normal operation, the ESD protection circuit does not operate. When the electro-static discharging occurs, the ESD protection circuit provides the channel for electrostatic discharging. In particular, when the display apparatus is in normal operation, Vgh>VDATA>Vgl, wherein Vgh represents the high level output from the high level output terminal is represented, VDATA represents the data line voltage, and Vgl represents the low level output from the low level output terminal. For example, the voltage VDATA of data line DATA is 0~5V, the high level Vgh is 10~15V, and the low level Vgl is −10~15V. At this time, since both of the gate and the source of the third thin film transistor T3 are connected to the low level output terminal VGL, i.e. the gate-source voltage of T3 is Vgs=0V, and thereby T3 is turned on, so that the gate voltage of T1 is released to VGL. The voltage difference stored in capacitor C is VDATA−Vgl, the gate-source voltage of T1 is Vgs=Vgl−VDATA. T1 is turned off due to Vgl<VDATA. Meanwhile, the gate-source voltage of T2 is Vgs=Vgl−VDATA. T2 is turned off for the same reason. Therefore, when the display apparatus is in normal operation, both T1 and T2 are turned off, which does not affect the normal display of the display apparatus. When electro-static discharging occurs, if the positive charges accumulated on the data line DATA connected with the discharging terminal O are released, positive high pulse appears in data line voltage VDATA. Positive high voltage is represented as VHI, and VHI is much greater than Vgh. Due to the bootstrap function of the capacitor C, i.e. the voltage difference between the gate of T1 and data line DATA maintained unchangeable as VDATA−Vgl, and voltage on the data line is VHI, and thus the gate voltage of T1 is increased to VHI−(VDATA−Vgl). At this time, the terminal voltage of T1 connected to VGH is the least, so the source and the drain of T1 exchange. At this time, the terminal of T1 connected to VGH serves as the source, the terminal of T1 connected to the data line DATA serves as the drain, and the gate voltage of T1 is much greater than the source voltage, so that T1 is turned on, which makes the positive charges on data line DATA released from T1 to VGH. If the negative charges accumulated on data line DATA are released, the negative high voltage pulses appear on data line DATA. The negative high voltage is represented as VLO and VLO is much less than Vgl. At this time, the gate-source voltage of T2 is Vgs=Vgl−VLO, and thus T2 is turned on, so that the negative charges on the data line are released from T2. It should be noted that the discharging terminal O also can be connected to the gate line for releasing static charge on the gate line. The detailed operation process and principle are similar to that of the above mentioned embodiment, details omitted.

The ESD protection circuit of the embodiment according to the present invention solves the problem of leak electricity from depletion type TFT existing in conventional ESD protection circuits when the display apparatus is in normal operation. It decreases the power consumption while increasing the reliability of the display apparatus.

Figure 3:
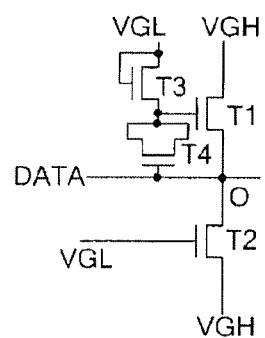
FIG. 3 is a schematic diagram of another electro-static discharging protection circuit according to an embodiment of the present invention.

Further, the above mentioned voltage difference maintaining unit can be the capacitor C which is directly made from metal layers, or as is shown in FIG. 3, the above mentioned voltage difference maintaining unit can be the fourth thin film transistor T4, having a source connected to the drain thereof and the gate of the first thin film transistor T1 and a gate connected to the discharging terminal O. Since an insulation layer is present between the gate and the source-drain of the fourth transistor T4, such a T4 can serve as a capacitor, and the gate and source-drain of the T4 are the two poles of the capacitor respectively. Therefore, T4 performs the same function as the capacitor, so that the voltage difference between the gate of the first thin film transistor T1 and the discharging terminal O is maintained unchangeable. Particular circuit configuration and operating principle are similar to those of the above mentioned embodiment, details omitted. It should be noted that T4 can be either depletion type or enhancement type, because the function of the fourth thin film transistor T4 is different from those of other thin film transistors described above.

The ESD protection circuit of the embodiment according to the present invention solves the problem of leak electricity from depletion type TFT existing in conventional ESD protection circuits when the display apparatus is in normal operation. It decreases the power consumption while increasing the reliability of the display apparatus.

Figure 4:
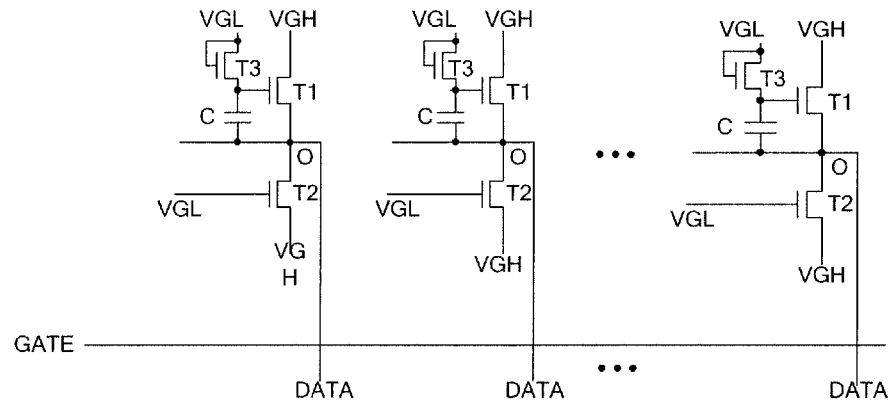
FIG. 4 is a schematic diagram of an array substrate according to an embodiment of the present invention.
Figure 5:
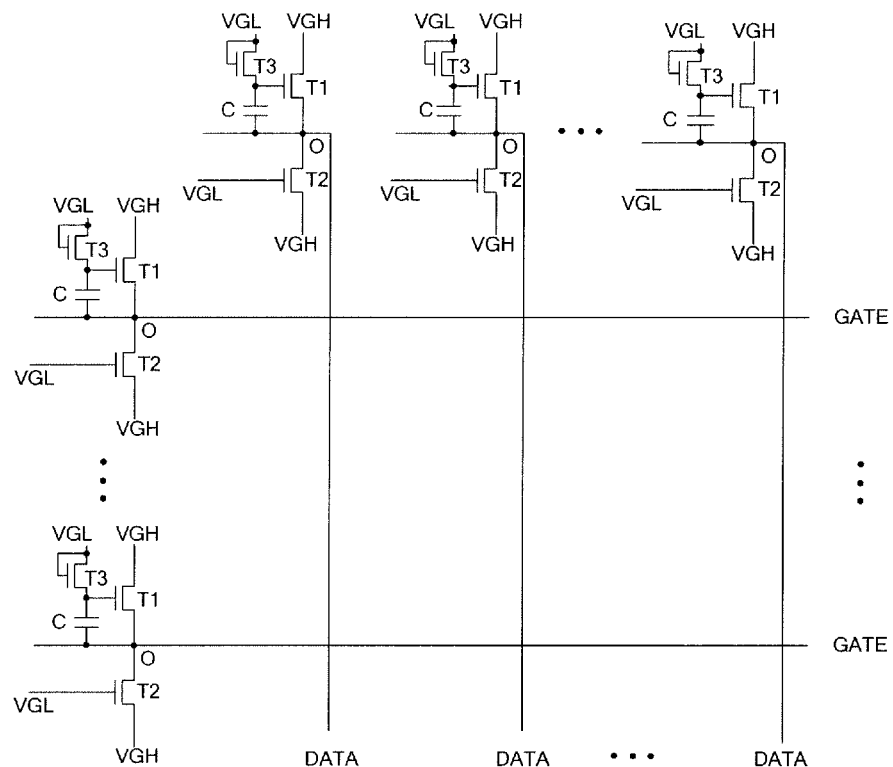
FIG. 5 is a schematic diagram of another array substrate according to an embodiment of the present invention.

As shown in FIG. 4, according to an embodiment of the present invention, further provided is an array substrate, comprising: a plurality of gate lines GATE and data lines DATA; a plurality of the above mentioned ESD protection circuits;

wherein each of the data lines DATA is connected with the discharging terminal O in one ESD protection circuit, for releasing the static charge on the data lines DATA. Alternatively, each of the gate lines DATE is connected with the discharging terminal O in one ESD protection circuit (not shown in figures), for releasing the static charge on the gate lines. Optionally, as is shown in FIG. 5, each of the gate lines GATE and the data lines DATA are connected to the discharging terminal O in one ESD protection circuit respectively, for releasing the static charge on the data lines and the gate lines.

Particular circuit configuration and operating principle of the ESD protection circuit in the present embodiment are similar to those of the above mentioned embodiment, details omitted.

The array substrate of the embodiment according to the present invention solves the problem of leak electricity from depletion type TFT existing in conventional ESD protection circuits when the display apparatus is in normal operation. It decreases the power consumption while increasing the reliability of the display apparatus.

According to another embodiment of the invention, further provided is a display apparatus, comprising: the above mentioned array substrate. Particular circuit configuration and operating principle of the ESD protection circuit in the present embodiment are similar to those of the above mentioned embodiment, details omitted.

The display apparatus of the embodiment according to the present invention solves the problem of leak electricity from depletion type TFT existing in conventional ESD protection circuits when the display apparatus is in normal operation. It decreases the power consumption while increasing the reliability of the display apparatus.

The above are described in details the embodiments of the present invention, and the protection scope of the present invention is not limited thereto. Any modification or replacement easily conceived by those skilled in the art who are familiar with the present technical field within the technical scope disclosed in the present invention should be considered as falling into the protection scope of the present invention. Therefore, the scope sought for the present invention. Therefore, the scope sought for protection in the present disclosure should be subject to the scope sought for protection in the claims.

What is claimed is:

1. An electro-static discharging protection circuit comprising:
    a first thin film transistor, having a drain connected to a high level output terminal;
    a second thin film transistor, having a source connected to a source of the first thin film transistor as a discharging terminal, a drain connected to the high level output terminal and a gate connected to a low level output terminal;
    a third thin film transistor, having a source and a gate connected to the low level output terminal and a drain connected to the gate of the first thin film transistor; and
    a voltage difference maintaining unit connected between the gate of the first thin film transistor and the discharging terminal, wherein the voltage difference maintaining unit is used to make the voltage difference between the gate of the first thin film transistor and the discharging terminal maintain unchanged, the discharging terminal being used for connecting gate lines or data lines.

2. The electro-static discharging protection circuit of claim 1, wherein the voltage difference maintaining unit is a capacitor.

3. The electro-static discharging protection circuit of claim 1, wherein the voltage difference maintaining unit is a fourth thin film transistor, having a source connected to a drain thereof and the gate of the first thin film transistor, and a gate connected to the discharging terminal.

4. An array substrate comprising:
    a plurality of gate lines and data lines; and
    a plurality of electro-static discharging protection circuits comprising:
        a first thin film transistor, having a drain connected to a high level output terminal;
        a second thin film transistor, having a source connected to the source of the first thin film transistor as a discharging terminal, a drain connected to the high level output terminal and a gate connected to a low level output terminal;
        a third thin film transistor, having a source and a gate connected to the low level output terminal and a drain connected to the gate of the first thin film transistor; and
        a voltage difference maintaining unit connected between the gate of the first thin film transistor and the discharging terminal, wherein the voltage difference maintaining unit is used to make the voltage difference between the gate of the first thin film transistor and the discharging terminal maintain unchanged, the discharging terminal being used for connecting gate lines or data lines,
    wherein each gate line and/or each data line is connected to the discharging terminal of one of the electro-static discharging circuits.

5. The array substrate of claim 4, wherein the voltage difference maintaining unit is a capacitor.

6. The array substrate of claim 4, wherein the voltage difference maintaining unit is a fourth thin film transistor, having a source connected to a drain thereof and the gate of the first thin film transistor, and a gate connected to the discharging terminal.

7. A display apparatus comprising: an array substrate, the array substrate comprises:
    a plurality of gate lines and data lines; and
    a plurality of electro-static discharging protection circuits comprising:
        a first thin film transistor, having a drain connected to a high level output terminal;
        a second thin film transistor, having a source connected to the source of the first thin film transistor as a discharging terminal, a drain connected to the high level output terminal and a gate connected to a low level output terminal;
        a third thin film transistor, having a source and a gate connected to the low level output terminal and a drain connected to the gate of the first thin film transistor; and
        a voltage difference maintaining unit connected between the gate of the first thin film transistor and the discharging terminal, wherein the voltage difference maintaining unit is used to make the voltage difference between the gate of the first thin film transistor and the discharging terminal maintain unchanged, the discharging terminal being used for connecting gate lines or data lines,
    wherein each gate line and/or each data line is connected to the discharging terminal of one of the electro-static discharging circuits.

* * * * *